United States Patent [19]

Hamatani

[11] 4,232,241

[45] Nov. 4, 1980

[54] ELECTRIC CIRCUIT FOR DRIVING A PIEZOELECTRIC VIBRATOR

[75] Inventor: Mitsuhiro Hamatani, Tokyo, Japan

[73] Assignee: Kabushiki Kaisha Seikosha, Tokyo, Japan

[21] Appl. No.: 909,309

[22] Filed: May 24, 1978

[30] Foreign Application Priority Data

May 26, 1977 [JP] Japan ................................ 52-67936

[51] Int. Cl.² ................................ H01L 41/10

[52] U.S. Cl. ................................ 310/317

[58] Field of Search .................. 310/314, 26, 316–318; 318/116, 118

[56] References Cited

U.S. PATENT DOCUMENTS 3,125,295 3/1964 Moss et al. ........................ 318/116 X
3,708,701 1/1973 Kawada ................................ 310/318
3,743,868 7/1973 Kawada ................................ 310/318

FOREIGN PATENT DOCUMENTS 411918 2/1971 U.S.S.R. ................................ 310/317

*Primary Examiner*—Mark O. Budd
*Attorney, Agent, or Firm*—Robert E. Burns; Emmanuel J. Lobato; Bruce L. Adams

[57] ABSTRACT

A diode and a coil are connected in series to the output side of a driving circuit switched ON and OFF upon receipt of a pulse signal and a piezoelectric vibrator is connected in parallel with the series-connected diode and coil. The piezoelectric vibrator is driven by a reverse induced voltage produced in the coil when the driving circuit is switched OFF so as to apply more electric energy for driving the piezoelectric vibrator than would be the case if the diode were omitted.

4 Claims, 6 Drawing Figures

FIG. 4
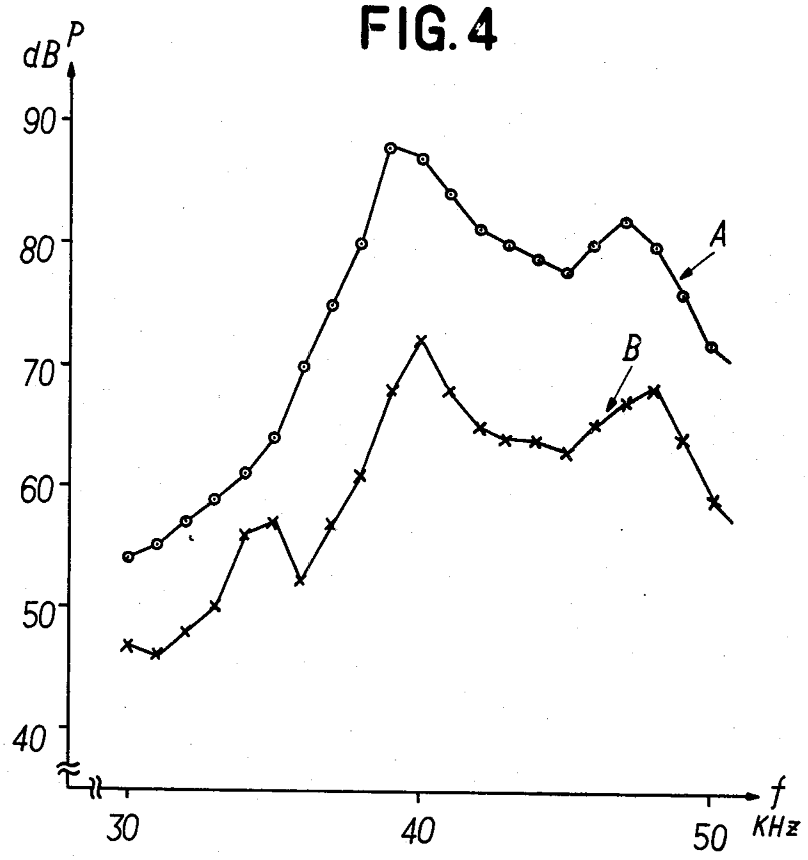
Prior Art FIG. 5
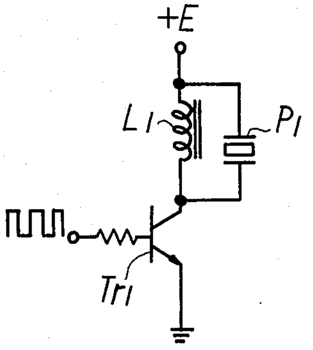
FIG. 6 Prior Art
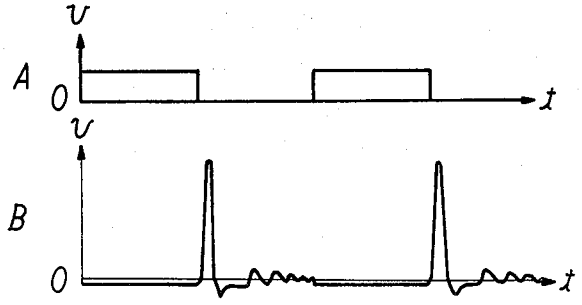

ELECTRIC CIRCUIT FOR DRIVING A PIEZOELECTRIC VIBRATOR

BACKGROUND OF THE INVENTION

This invention relates to an electric circuit for driving a piezoelectric vibrator. One type prior art transistor circuit is shown in FIG. 5 as an example of a conventional driving circuit for a piezoelectric vibrator.

In FIG. 5, when a transistor $T_{r1}$ has been turned OFF at the trailing edge of each pulse depicted by a waveform A of FIG. 6, the piezoelectric vibrator $P_1$ is applied with a damped oscillation voltage depicted by a waveform B of FIG. 6. The effective electric energy for driving the piezoelectric vibrator P, however, is contained only in the first pulse of narrow width of each repeating wave pattern. Consequently, it was hard to gain much driving force. For that reason, for instance, in case the driving circuit is used as a vibration source of a sound generator, it had a defect of being unable to produce a high sound pressure level.

It is known that if the number of turns in the winding of the coil $L_1$ is increased, the sound pressure level will be increased. But as the number of turns is increased, the space occupied by the coil $L_1$ is also expanded. Therefore, it is hard to adopt it to a small-sized device such as a small sized electronic alarm timepiece. In addition, though it may be possible to adopt a transformer as a driving circuit, such is undesirable in view of the space requirements.

SUMMARY OF THE INVENTION

This invention relates to an electric circuit for driving a piezoelectric vibrator, and more particularly to an electric circuit for applying much driving force to the piezoelectric vibrator.

One feature of the invention is that a piezoelectric vibrator connected in parallel to a series circuit of a coil and a diode is driven by a reverse voltage induced in the coil so that more electric energy can be applied to the piezoelectric vibrator without increasing the number of turns of the coil.

BRIEF DESCRIPTION OF THE DRAWINGS

The nature of the invention, as well as other objects and advantages thereof, will become more apparent from consideration of the following detailed description and the accompanying drawings in which:

FIG. 4 shows experimental curved lines showing the relationship between sound pressure and frequencies to drive a driving circuit;

FIG. 5 shows a conventional electric circuit for driving a piezoelectric vibrator and;

FIG. 6 is a time chart showing waveforms of principal parts of FIG. 5.

PREFERRED EMBODIMENT OF THE INVENTION

Figure 1:
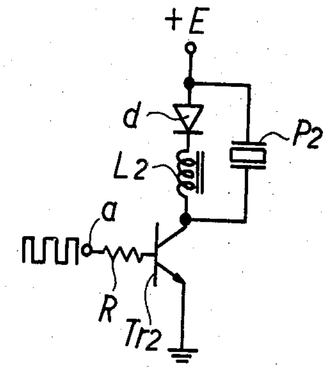
FIG. 1 shows an electric circuit for driving a piezoelectric vibrator according to one embodiment of the invention.
Figure 2:
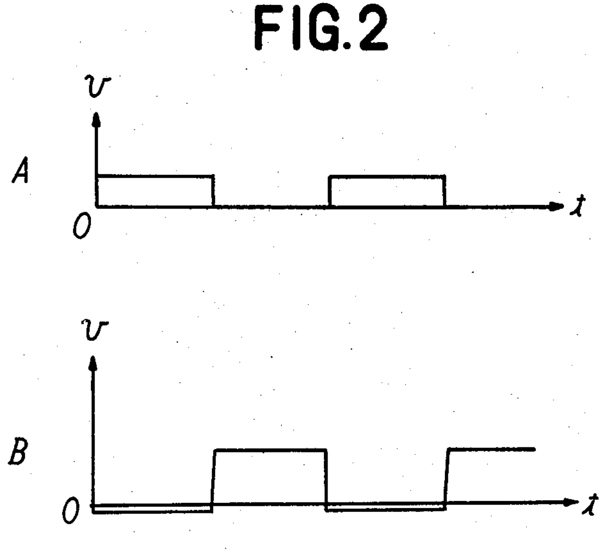
FIG. 2 is a time chart showing waveforms of principal parts of FIG. 1.

Referring now to FIG. 1, a pulse signal depicted by a waveform A of FIG. 2, whose ordinate represents time t and whose abscissa represents voltage v, is applied to a terminal a and supplied to the base of a transistor $T_{r2}$ through a resistor R. When the transistor $T_{r2}$ is kept ON by the pulse signal, electric current flows in a coil $L_2$ from a d.c. voltage source E through a diode *d*. But, when the transistor $T_{r2}$ has been turned OFF at the trailing edge of each pulse depicted by the waveform A, a reverse induced voltage depicted by a waveform B of FIG. 2, whose ordinate represents time t and whose abscissa represents voltage v along the coil $L_2$, is produced in the coil $L_2$ so as to bias the diode d in the forward direction. Consequently, the induced voltage is applied to the piezoelectric vibrator $P_2$. As seen from the waveform B of FIGS. 2 and 6, the electric energy applied to the piezoelectric vibrator $P_2$ increases far more than that of the prior driving circuit, and thus a high sound pressure level is obtained.

Figure 3:
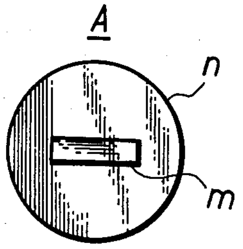
FIG. 3 is a plan view of a vibrator adhered to a piezoelectric ceramics on a metal vibration plate.

This enhanced sound pressure level feature of the present invention, further, will be made more clear by the following experimental results. Referring to FIG. 3, the vibrator A is composed of a metal vibration plate n and a piezoelectric ceramics m adhered thereon. The metal vibration plate n is made from a stainless steel material and the diameter and thickness thereof are 14 mm and 0.1 mm respectively. The piezoelectric ceramics m has a shape that a long side, a short side and a thickness are 10 mm, 2 mm and 0.2 mm respectively. Each of the coils $L_1$ and $L_2$ has 1400 turns in the winding and the diameter of the coil wire is 0.05 mm. The voltage of the voltage source E is 1.5 Volt. In addition, the metal vibration plate is put in its resonant vibrational mode. In such a condition, the sound pressure at different frequencies of the pulse signal supplied to the transistors $T_{r1}$, $T_{r2}$ has been measured 10 cm apart from the resonant case. The resultant relations are shown in FIG. 4, whose ordinate represents the sound pressure level P and whose abscissa represents the frequency F of the pulse signal. The curved line A indicates the characteristic of this invention and the curved line B indicates that of the prior art. It is clear from the curves A and B that the sound pressure level of this invention is increased far more than that of the prior art.

In the aforedescribed embodiment of this invention, a transistor was utilized in the driving circuit and it is understood that any suitable switching means may be utilized.

As mentioned above in detail, since the invention is characterized in that a coil and a diode are connected in series to the output side of the driving circuit and the piezoelectric vibrator is connected in parallel to the aforementioned two electric circuit elements, the piezoelectric vibrator is driven by a considerably high driving force, and thus the high sound pressure level is obtained.

In addition, the number of turns of the coil according to the invention is few in comparison with that of the prior art for the same sound pressure level output. Consequently it is convenient to utilize the electric drive circuit of the invention for a small sized device such as a sound generator of an electronic alarm timepiece.

I claim:

1. In an electric circuit for driving a piezoelectric vibrator of the type comprising a parallel circuit comprised of a coil connected in parallel with the piezoelectric vibrator with one side of the parallel circuit connected to a voltage supply source and the other side of the parallel circuit connected to a switching means for switching between ON and OFF states in response to pulse signals applied thereto to thereby apply driving forces to said piezoelectric vibrator; the improvement comprising means including a diode connected in series with said coil such that the series-connected diode and coil are in parallel with said piezoelectric vibrator for applying the reverse induced voltage produced in said coil during the OFF states of said switching means to said piezoelectric vibrator to thereby apply driving forces of greater magnitude to said piezoelectric vibrator than would otherwise occur without said diode.

2. The electric circuit according to claim 1; wherein said diode is connected between said voltage supply source and said coil.

3. The electric circuit according to claims 1 or 2; wherein said diode is connected so as to be forwardly biased with respect to said voltage supply source.

4. The electric circuit according to claim 3; wherein said switching means comprises a transistor having a base to which are applied the pulse signals, and a collector-emitter path connected to said other side of said parallel circuit.

* * * * *